United States Patent
Jun et al.

[11] Patent Number: 6,021,786
[45] Date of Patent: Feb. 8, 2000

[54] WAFER TREATMENT METHOD USING HYDROPHILIC MAKING FLUID SUPPLY

[75] Inventors: Seung-ho Jun, Seongnam; Sang-bok Lee; Dong-tae Kim, both of Suwon, all of Rep. of Korea

[73] Assignee: Samsung Electronics Co., Ltd., Suwon, Rep. of Korea

[21] Appl. No.: 09/237,885

[22] Filed: Jan. 27, 1999

Related U.S. Application Data

[62] Division of application No. 08/773,340, Dec. 26, 1996, abandoned.

[30] Foreign Application Priority Data

Mar. 30, 1996 [KR] Rep. of Korea .................... 96-9576

[51] Int. Cl.[7] ........................................ B08B 6/00
[52] U.S. Cl. ........................ 134/1.3; 134/36; 134/2
[58] Field of Search .................... 134/153, 902, 134/151, 1, 36, 1.2, 1.3, 2

[56] References Cited

U.S. PATENT DOCUMENTS

| | | | |
|---|---|---|---|
| 4,688,918 | 8/1987 | Suzuki | 354/325 |
| 5,296,266 | 3/1994 | Kunugi et al. | 427/213.36 |
| 5,487,398 | 1/1996 | Ohmi et al. | 134/95.1 |
| 5,778,911 | 7/1998 | Yoshio | 134/104.2 |

OTHER PUBLICATIONS

Kern, Werner. Handbook of Semiconductor Cleaning Technology. Noyes Publications. pgs. 128–129.

*Primary Examiner*—Randy Gulakowski
*Assistant Examiner*—Paul J. Lee
*Attorney, Agent, or Firm*—Jones Volentine, L.L.P.

[57] ABSTRACT

A semiconductor manufacturing apparatus for rinsing a wafer after chemically treating the wafer includes a spin chuck for holding the wafer, a first supply nozzle located above the spin chuck and a second nozzle connected to a lower end of the spin chuck. First and second chemical fluid supply pipes are connected at one end to a chemical fluid supply and at the other end to respective ends of the first and second supply nozzles. First and second deionized water supply pipes are connected at one end to a deionized water supply and at the other end to respective ends of the first and second supply nozzles. A hydrophilic-making fluid supply pipe is connected at one end to hydrophilic-making fluid supply and at the other end to the end of the first supply nozzle. It is thus possible to prevent the generation of watermarks at the boundary between hydrophobic material and hydrophilic material by performing a rinsing operation after changing the hydrophobic material into hydrophilic material.

5 Claims, 3 Drawing Sheets

WAFER TREATMENT METHOD USING HYDROPHILIC MAKING FLUID SUPPLY

CROSS REFERENCE TO RELATED APPLICATIONS

This is a divisional application of Ser. No. 08/773,340, filed Dec. 26, 1996, now abandoned. The entire contents of which are hereby incorporated by reference for all purposes.

BACKGROUND OF THE INVENTION

1. Field of the Invention

The present invention relates to a semiconductor manufacturing apparatus and a manufacturing method using the same, and more particularly, to a spin etcher employing a hydrophilic making fluid supply for rinsing a wafer after chemically treating the wafer and a wafer treatment method using the same.

2. Description of the Related Art

FIG. 1 is a schematic view showing a conventional semiconductor manufacturing apparatus for chemically treating a wafer, wherein a spin etcher is provided.

The conventional spin etcher comprises a spin chuck 10 which holds the wafer, a first supply nozzle 12 installed above the spin chuck 10, a second supply nozzle 10a connected to the lower portion of the spin chuck 10, first and second chemical fluid supply pipes 14a and 14b connected to the respective first and second nozzles 12 and 10a, and first and second deionized water supply pipes 20a and 20b connected to the respective first and second nozzles 12 and 10a.

Air valves 16a, 16b, 22a and 22b, installed at their respective supply pipes 14a, 14b, 20a and 20b, control the amount of fluid flowing through the supply pipes.

The first chemical fluid supply pipe 14a supplies chemical fluid through a first pipe 14 from a container 18 containing chemical fluid to the upper surface of the wafer 30. The second chemical fluid supply pipe 14b supplies chemical fluid from container 18 to the lower surface of the wafer 30. Also, the first deionized water supply pipe 20a supplies deionized water through a second pipe 20 from a deionized water supply 24a to the upper surface of the wafer 30. The second deionized water supply pipe 20b supplies deionized water from deionized water supply 24a to the lower surface of the wafer 30.

The wafer 30 is fixed to the spin chuck 10 by pins (not shown) installed at the edge of the spin chuck 10.

After fixing the wafer 30 to the spin chuck 10, an etching process can proceed by supplying chemical fluid to the upper and lower surfaces of the wafer 30 through first and second chemical fluid supply pipes 14a and 14b. Here, the spin chuck 10 rotates as indicated by the arrow R so that chemical fluid is uniformly dispersed over the entire surface of the wafer 30.

Thereafter, the chemically etched wafer is rinsed by deionized water supplied to the upper and lower surfaces of the wafer 30 through first and second deionized water supply pipes 20a and 20b.

For example, in the process for etching an oxide film (not shown) formed on the wafer 30, a residue of silica ($Si_xO_y$) is formed at the boundary between the bare silicon portion (the portion where the oxide film is etched) activated by the chemical fluid and the oxide film portion. However, the residue of silica is not removed during the subsequent rinse step due to the difference between the surface tensions of the bare silicon portion to deionized water and those of the oxide film portion to deionized water. This generates silica watermarks at the boundary between the silicon portion and the oxide film portion after the wafer is dried.

The watermarks are generated because the oxide film is a hydrophilic material while the bare silicon is a hydrophobic material. Thus, the residue of silica covered by this deionized water remains due to the difference between the surface tensions, as deionized water supplied to the boundary between the hydrophilic material and the hydrophobic material is dried without dehydration. The watermarks should be removed because they may cause contamination during subsequent wafer manufacturing processes.

SUMMARY OF THE INVENTION

Accordingly, it is an object of the present invention to provide a semiconductor manufacturing apparatus wherein the generation of watermarks at the boundary between a hydrophilic material and a hydrophobic material are prevented.

It is another object of the present invention to provide a method for treating a wafer by the above manufacturing apparatus.

To achieve one aspect of the above objects, there is provided a semiconductor manufacturing apparatus for rinsing a wafer after chemically treating the wafer, comprising: a spin chuck for holding the wafer; a first supply nozzle located above the spin chuck and a second nozzle connected to a lower end of the spin chuck; first and second chemical fluid supply pipes, each connected at one end to a chemical fluid supply and at the other end to respective ends of the first and second supply nozzles; first and second deionized water supply pipes, each connected at one end to a deionized water supply and at the other end to respective ends of the first and second supply nozzles; and a hydrophilic-making fluid supply pipe connected at one end to a hydrophilic-making fluid supply and at the other end to the end of the first supply nozzle.

In another aspect, the hydrophilic-making fluid supply pipe has one end connected to a hydrophilic-making fluid supply and the other end connected to the first deionized water supply pipe.

In still another aspect, the invention provides a wafer treatment method for rinsing a wafer, the method comprising the steps of: chemically treating a wafer; rinsing the chemically treated wafer with deionized water; providing a hydrophilic-making fluid to said rinsed wafer; and rinsing said wafer to remove said hydrophilic-making fluid and any residue. In one embodiment oxygenated water is used as the hydrophilic-making fluid.

Therefore, in the semiconductor manufacturing apparatus and the wafer treatment method using the same according to the present invention, it is possible to prevent the generation of watermarks at the boundary between the hydrophilic material and the hydrophobic material by performing a rinsing operation after changing the hydrophobic material into the hydrophilic material.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
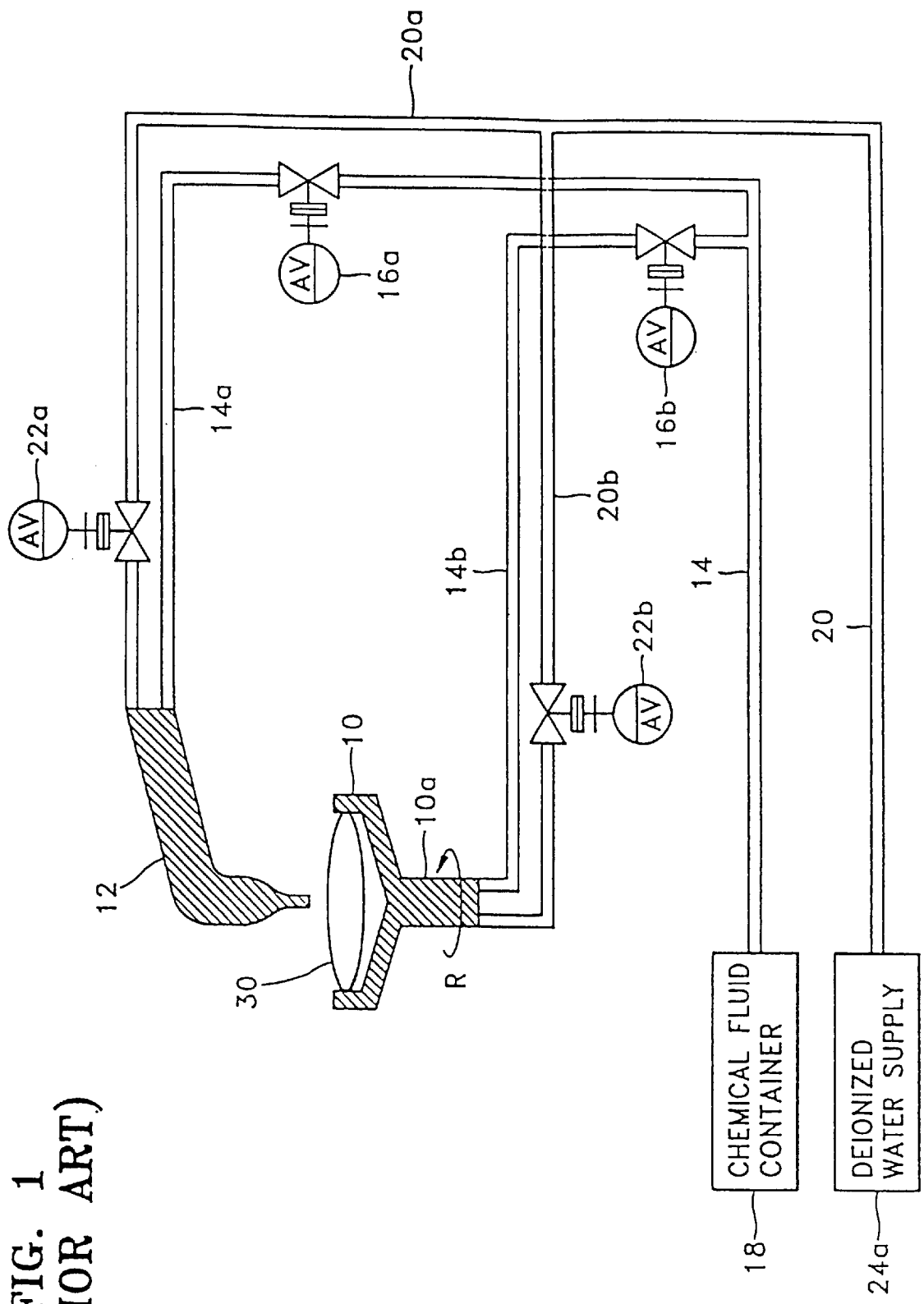
FIG. 1 is a schematic view of a conventional semiconductor manufacturing apparatus for treating a wafer.
Figure 2:
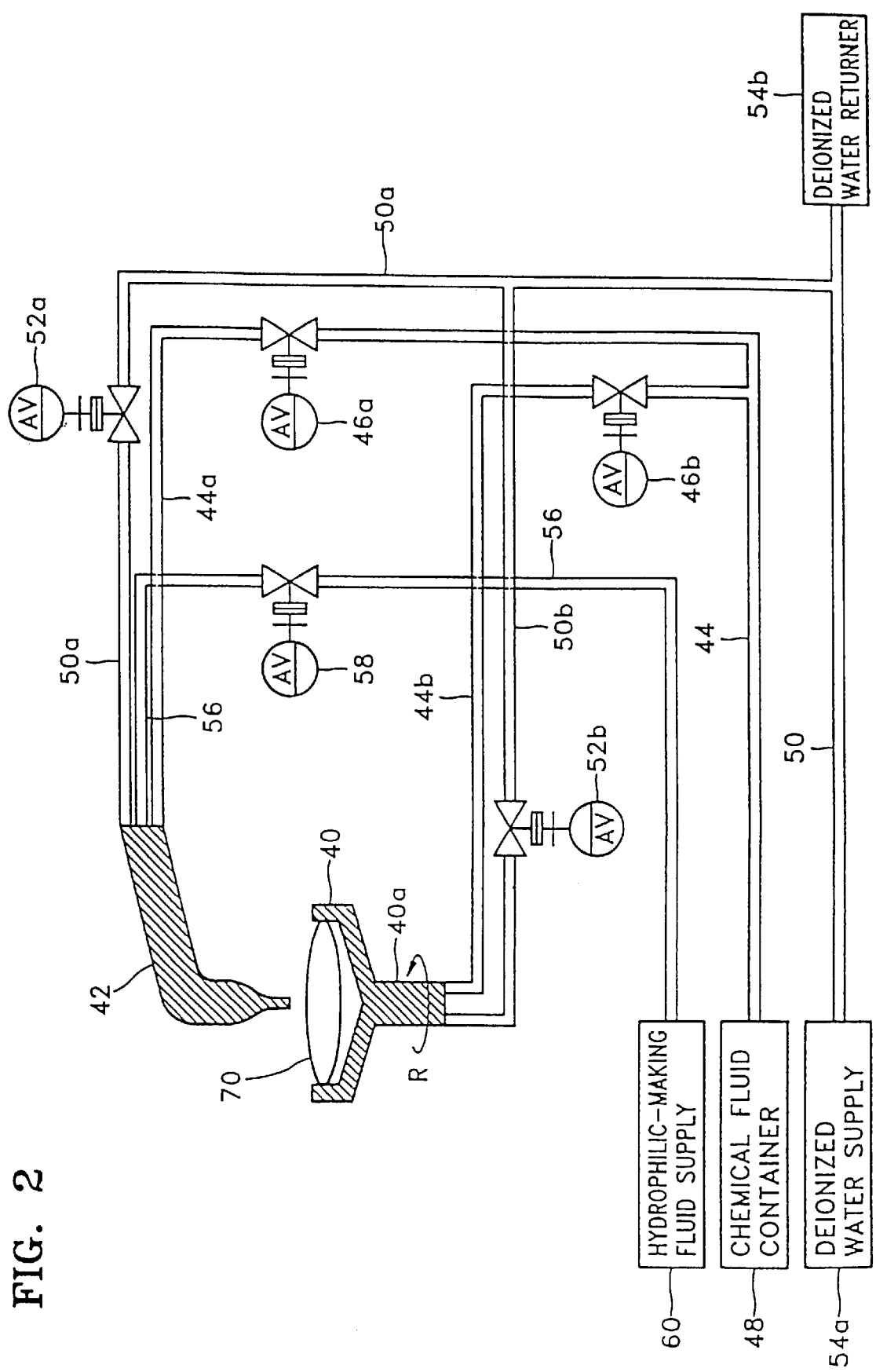
FIG. 2 is a schematic view of a semiconductor manufacturing apparatus according to a first embodiment of the present invention.

FIG. 2 is a schematic view of a semiconductor manufacturing apparatus according to an embodiment of the present invention emphasizing a spin etcher portion.

The spin etcher according to the first embodiment includes a spin chuck 40 which holds a wafer 70, a first supply nozzle 42 installed above the spin chuck 40, a second supply nozzle 40a connected to the lower portion of spin chuck 40, first and second chemical fluid supply pipes 44a and 44b connected to the respective ends of the first and second supply nozzles 42 and 40a, first and second deionized water supply pipes 50a and 50b connected to the respective ends of the first and second supply nozzles 42 and 40a, and a supply pipe 56 for fluid, which makes materials hydrophilic, connected to the end of the first supply nozzle 42.

Here, first, second, third, fourth, and fifth air valves 46a, 46b, 52a, 52b, and 58 are installed in the respective supply pipes 44a, 44b, 50a, 50b, and 56 to control the amount of fluid flowing through the supply pipes.

The first chemical fluid supply pipe 44a supplies chemical fluid through a first pipe 44 from a container 48 containing chemical fluid to the upper surface of a wafer 70. The second chemical fluid supply pipe 44b supplies chemical fluid from container 48 to the lower surface of the wafer 70. The first deionized water supply pipe 50a supplies deionized water through a second pipe 50 from a deionized water supply 54a to the upper surface of the wafer 70. The second deionized water supply pipe 50b supplies deionized water from deionized water supply 54a to the lower surface of the wafer. Also, the supply pipe 56 supplies fluid from a supply 60 of hydrophilic-making fluid to the upper surface of the wafer 70. Oxygenated water may be used as hydrophilic-making fluid in the present invention.

The wafer 70 is fixed to the spin chuck 40 by pins (not shown) installed at the edge of the spin chuck 40. Also, deionized water returns to a deionized water returner 54b when deionized water is not supplied to the wafer.

Figure 3:
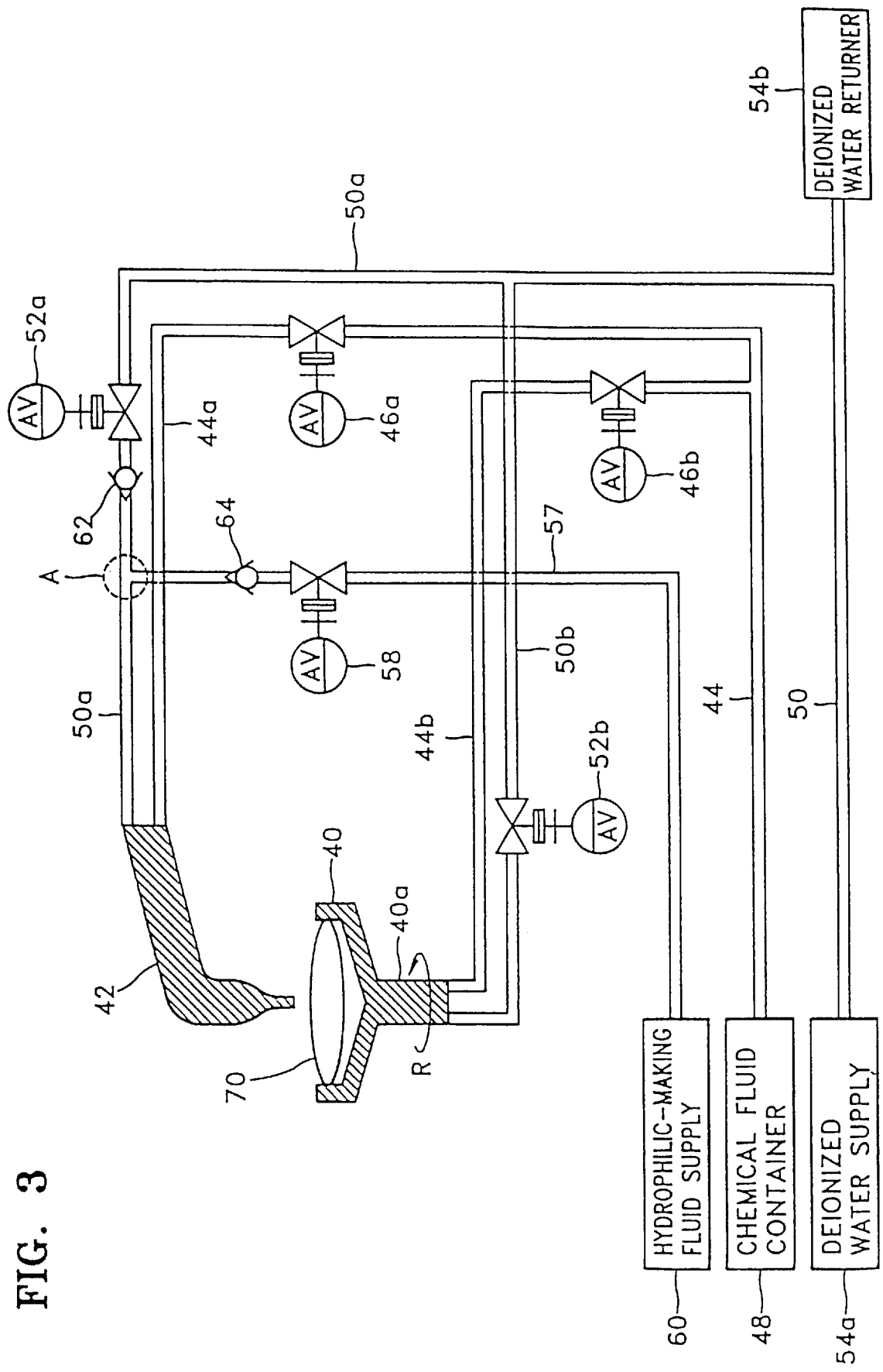
FIG. 3 is a schematic view of a semiconductor manufacturing apparatus according to a second embodiment of the present invention.

FIG. 3 is a schematic view showing a semiconductor manufacturing apparatus for treating a wafer according to a second embodiment of the present invention.

Unlike the spin etcher according to the first embodiment, in the spin etcher according to a second embodiment of the present invention, a supply pipe 57 of hydrophilic-making fluid is not directly connected to the end of the first supply nozzle 42, but rather to the first deionized water supply pipe 50a (shown as position A in FIG. 3). The first, second, third, fourth, and fifth air valves 46a, 46b, 52a, 52b, and 58 are installed in the respective supply pipes 44a, 44b, 50a, 50b, and 57.

Also, a first check valve 62 for preventing reverse flow of fluid is installed at the front end of the first deionized water supply pipe 50a, downstream of the third air valve 52a. More specifically, the first check valve 62 is installed between the portion shown as A in FIG. 3 (where the supply pipe 57 of hydrophilic-making fluid and the first deionized water supply pipe 50a are connected) and the third air valve 52a. A second check valve 64 for preventing the reverse flow of fluid is installed at the front end of supply pipe 57 of hydrophilic-making fluid, namely, between said portion A and the fifth air valve 58.

Here, the first check valve 62 is installed to prevent the reverse flow of deionized water when hydrophilic-making fluid or chemical fluid is supplied to the wafer 70 and the second check valve 64 is installed to prevent a reverse flow of hydrophilic-making fluid when chemical fluid or deionized water is supplied to the wafer 70.

A wafer treatment method using the above-described semiconductor manufacturing apparatus will now be discussed in detail.

In the first step, the wafer 70, on whose surface an oxide film (not shown) is formed, is fixed to the spin chuck 40.

In the second step, the wafer is etched by a chemical fluid supplied to each of the upper and lower surfaces of the wafer 70 from the container 48 by controlling the first and second air valves 46a and 46b to open the first and second chemical fluid supply pipes 44a and 44b. At this time, the chemical fluid partially etches the oxide film formed on the surface of the wafer 70 by being uniformly dispersed on the entire surface of the wafer 70 by the rotation of the spin chuck 40 in accordance with arrow R in FIG. 3.

In step three, the wafer is rinsed a first time by supplying deionized water to each of the upper and lower surfaces of the wafer 70 from the deionized water supply 54a by controlling the third and fourth air valves 52a and 52b to open the first and second deionized water supply pipes 50a and 50b. The deionized water is supplied only after stopping the supply of chemical fluid by closing the first and second air valves 46a and 46b.

In step four, after stopping the supply of deionized water by closing the third and fourth air valves 52a and 52b, a hydrophilic-making fluid is supplied to the upper surface of the wafer 70 from the supply 60 of hydrophilic-making fluid by controlling the fifth air valve 58 to open the hydrophilic-making fluid supply pipe 57. At this time, hydrophilic-making fluid supplied to the wafer 70 makes the hydrophobic materials formed on the wafer 70 (e.g., the bare silicon and polysilicon after the removal of the oxide film) hydrophilic. Oxygenated water, for example, can be used as the hydrophilic-making fluid. It is understood, however, that other equivalent hydrophilic-making fluids may be used within the scope and practice of the present invention, for example, a mixture of deionized water , oxygenated water ($H_2O_2$), and ammonium hydroxide ($NH_4OH$).

In step five, after stopping the supply of hydrophilic-making fluid by closing the fifth air valve 58, a second rinsing operation is commenced whereby deionized water is supplied to the now hydrophilic wafer by controlling the third and fourth air valves 52a and 52b to open the first and second deionized water supply pipes 50a and 50b.

In step six, the wafer 70 is dried by rotating the spin chuck 40 after stopping the supply of deionized water by closing the third and fourth air valves 52a and 52b.

As described above, the hydrophobic material layer, formed on the wafer during the etching process in step two, is changed into a hydrophilic material layer during step four, using a hydrophilic-making fluid such as oxygenated water. Therefore, the conventional watermarks that arose as a result of the difference between the surface tensions, are not generated with the present inventive process when deionized water is supplied to the hydrophilic material layer (the material layer which was hydrophilic before the fourth step) or the material layer made hydrophilic (the material layer which was hydrophobic before the fourth step)

The residual silica generated during step two can thus be completely removed by deionized water supplied during the second deionized water rinsing process in step five.

Therefore, according to the semiconductor manufacturing apparatus and the wafer treatment method using the same, it is possible to prevent the generation of watermarks at the boundary between the hydrophilic material and the hydrophobic material by rinsing after making the hydrophobic materials hydrophilic.

The present invention is not restricted to the above embodiments, and it is clearly understood that many variations can be possible within the scope and spirit of the present invention by someone skilled in the art.

What is claimed is:

1. A wafer treatment method for rinsing a wafer, the method comprising:

chemically treating a wafer;

rinsing said chemically treated wafer with deionized water;

providing a hydrophilic-making fluid to said rinsed wafer to prevent generation of watermarks that form at boundaries between hydrophobic materials and hydrophilic materials on said wafer, said hydrophilic-making fluid making hydrophobically activated material hydrophilic;

rinsing said wafer to remove said hydrophilic-making fluid and any residue;

and drying said wafer by rotating a said wafer after rinsing said wafer to remove said hydrophilic-making fluid.

2. The wafer treatment method as claimed in claim 1, further comprising drying said wafer by rotating a said wafer after rinsing said wafer to remove said hydrophilic-making fluid.

3. The wafer treatment method as claimed in claim 1, wherein said hydrophilic-making fluid is fluid which makes the hydrophobically activated material hydrophilic.

4. The wafer treatment method as claimed in claim 1, further comprising using oxygenated water as said hydrophilic-making fluid.

5. The wafer treatment method as claimed in claim 1, wherein said chemically treating includes at least partially etching said wafer.

* * * * *